(12) United States Patent
Abbasi et al.

(10) Patent No.: US 6,397,051 B1
(45) Date of Patent: *May 28, 2002

(54) DUAL IMAGE-REJECT MIXER RECEIVER FOR MULTIPLE CHANNEL RECEPTION AND PROCESSING

(75) Inventors: Salman Yousef Abbasi, Clifton; Farhad Barzegar, Hillsborough; Jeremiah Okoro, Landing, all of NJ (US)

(73) Assignee: AT&T Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/217,924

(22) Filed: Dec. 21, 1998

(51) Int. Cl.[7] .............................. H04B 1/10; H04B 1/16; H04B 1/26

(52) U.S. Cl. ...................... 455/295; 455/207; 455/296; 455/313

(58) Field of Search ................................ 455/302, 303, 455/304, 317, 323, 207, 208, 209, 114, 118, 296, 313, 295, 325, 196.1, 285, 189.1, 146; 375/344, 346, 350

(56) References Cited

U.S. PATENT DOCUMENTS

| | | |
|---|---|---|
| 3,575,660 A | 4/1971 | Jorgensen |
| 3,681,697 A | 8/1972 | Moroney |
| 3,939,430 A | 2/1976 | Dickens et al. |
| 4,000,469 A | 12/1976 | McMaster |
| 4,234,965 A | 11/1980 | Bickley et al. |
| 4,243,955 A | 1/1981 | Daniel et al. |
| 4,263,676 A | 4/1981 | Liebel |
| 4,330,868 A | 5/1982 | Hallford |
| 4,383,334 A * | 5/1983 | Epsom ........................ 455/295 |
| 4,516,270 A | 5/1985 | Phillips |
| 4,528,674 A * | 7/1985 | Sweeney et al. ............ 375/208 |
| 4,560,945 A * | 12/1985 | Olver .......................... 330/149 |
| 4,584,715 A | 4/1986 | Baars et al. |

(List continued on next page.)

*Primary Examiner*—Vivian Chang
*Assistant Examiner*—Charles N. Appiah
(74) *Attorney, Agent, or Firm*—Joseph C. Redmond, Jr.; Morgan & Finnegan, LLP

(57) ABSTRACT

A system and method in which a dual image-reject mixer arrangement receives an RF signal having at least one channel. The dual image-reject mixer arrangement generates first and second signals corresponding to each channel of the RF signal. Each first and second signal includes a desired signal, an image frequency signal and an intermodulation signal. A feed-forward arrangement receives the first and second signals corresponding to each channel and outputs a third signal that is formed by constructively combining the desired signals corresponding to each channel and substantially cancelling the intermodulation signals corresponding to each channel. An in-phase and quadrature hybrid network receives the third signal and outputs an in-phase baseband signal and a quadrature baseband signal corresponding to each channel of the RF signal. A controller is coupled to the dual image-reject mixer arrangement and monitors the first and second signals, and controls an amplitude and a phase of the image frequency signals so that the image frequency signals are collectively minimized based on the monitored first and second signals. The controller is also coupled to the feed-forward arrangement and monitors the third signal. Based on the monitored third signals, the controller controls the amplitude and the phase of the intermodulation signals so that the intermodulation signals are collectively optimally cancelled.

11 Claims, 1 Drawing Sheet

U.S. PATENT DOCUMENTS

| | | |
|---|---|---|
| 4,591,859 A | 5/1986 | Campbell |
| 4,633,315 A | 12/1986 | Kasperkovitz |
| 4,662,001 A | 4/1987 | Cruz et al. |
| 4,696,055 A | 9/1987 | Marshall |
| 4,700,151 A | 10/1987 | Nagata |
| 4,718,113 A * | 1/1988 | Rother et al. ............... 455/209 |
| 4,720,673 A | 1/1988 | Hatfield |
| 4,771,397 A | 9/1988 | Brandstetter et al. |
| 4,801,900 A | 1/1989 | Mower |
| 4,811,425 A | 3/1989 | Feerst |
| 4,812,772 A | 3/1989 | Hatfield |
| 4,864,643 A * | 9/1989 | French et al. ............... 455/302 |
| 4,885,551 A * | 12/1989 | Myer ......................... 330/52 |
| 4,903,331 A * | 2/1990 | Kasperkovitz .............. 455/207 |
| 5,033,110 A | 7/1991 | Harman |
| 5,067,140 A | 11/1991 | Weinert |
| 5,077,532 A * | 12/1991 | Obermann et al. ......... 330/151 |
| 5,140,198 A * | 8/1992 | Atherly et al. ............... 327/113 |
| 5,325,401 A | 6/1994 | Halik et al. |
| 5,412,690 A * | 5/1995 | Kotzin et al. ................ 375/256 |
| 5,517,687 A | 5/1996 | Niehenke et al. |
| 5,574,755 A | 11/1996 | Persico |
| 5,613,233 A * | 3/1997 | Vagher ....................... 455/296 |
| 5,630,225 A | 5/1997 | Corman |
| 5,659,546 A * | 8/1997 | Elder ......................... 370/343 |
| 5,661,485 A | 8/1997 | Manuel |
| 5,749,051 A * | 5/1998 | Dent .......................... 455/324 |
| 5,850,598 A * | 12/1998 | Behrent ...................... 455/324 |
| 5,870,670 A * | 2/1999 | Ripley et al. ................ 455/304 |
| 5,983,078 A * | 11/1999 | Bossard ...................... 455/63 |
| 5,999,802 A * | 12/1999 | Aschwanden ............ 455/196.1 |
| 6,018,553 A * | 1/2000 | Sanielevici et al. ......... 375/334 |
| 6,144,845 A * | 11/2000 | Durec ......................... 455/285 |
| 6,192,225 B1 * | 2/2001 | Arpaia et al. ............ 455/196.1 |

\* cited by examiner

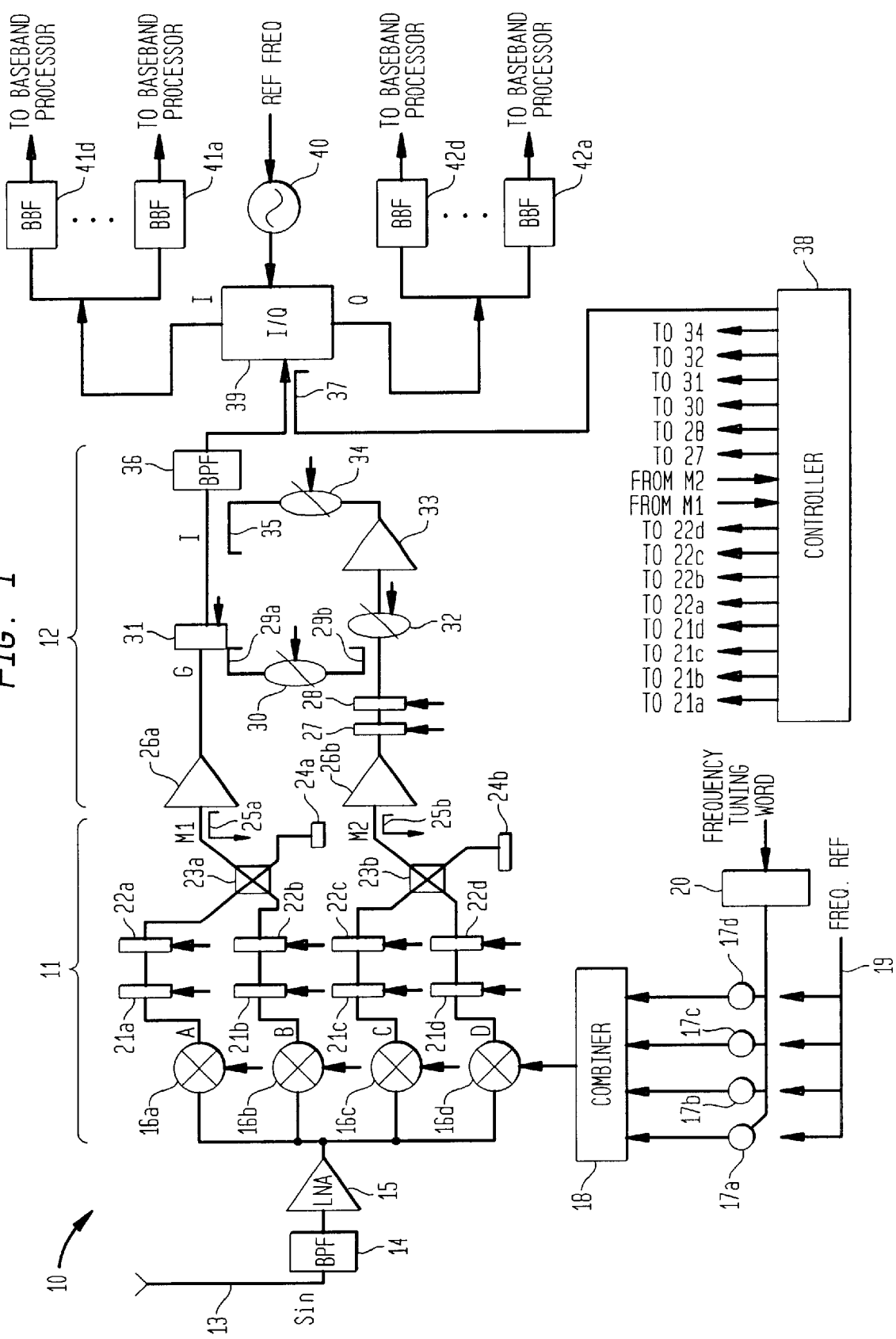

DUAL IMAGE-REJECT MIXER RECEIVER FOR MULTIPLE CHANNEL RECEPTION AND PROCESSING

CROSS-REFERENCE TO RELATED APPLICATION

The present application is related to commonly-assigned application Ser. No. 09/217,789, entitled "Image Frequency And Intermodulation Cancellation RF Module," invented by Jeremiah Okoro, filed Dec. 21, 1998, and incorporated by reference herein.

BACKGROUND OF THE INVENTION

1. Field of the Invention

The present invention relates to the field of radio systems. More particularly, the present invention relates to a system and a method for simultaneously receiving and processing multiple radio frequency (RF) channels.

2. Description of the Related Art

A separate receive path is required in a conventional RF receiver system for each channel carrier frequency so that each desired channel frequency band can be down-converted by a mixer and an associated local oscillator (LO). Consequently, for a single receiver system to simultaneously process multiple RF channels, a corresponding number of receive paths are required, thus increasing the complexity and cost of such a multi-channel receiver over that of a single channel receiver. In view of this drawback, many wireless services attempt to carry as much data as possible on a single RF carrier to avoid using a multi-channel receiver having a separate receive path for each RF channel. Unfortunately, the capacity of a single RF channel is limited and some wireless services provided over a single channel, such as a wireless video service, are severely hampered.

Therefore, what is needed is a technique that can be used for receiving a multi-channel RF signal using a single receive path, thereby avoiding the complexity and costs associated with receiving a multi-channel RF signal using conventional techniques.

SUMMARY OF THE INVENTION

The present invention provides a low-cost, efficient technique for simultaneously receiving and processing multiple RF channels in which each channel has different data rates using a single receive path. The advantages of the present invention are provided by a system and method in which a dual image-reject mixer arrangement receives an RF signal having at least one channel and a local oscillator signal having a frequency component corresponding to each channel of the RF signal. The dual image-reject mixer arrangement generates first and second signals corresponding to each channel of the RF signal, such that the first and second signal corresponding to each channel is substantially equal, and includes a desired signal and an image frequency signal. A feed-forward arrangement receives the first and second signals corresponding to each channel and outputting a third signal that is formed by constructively combining the desired signals corresponding to each channel and substantially cancelling the intermodulation signals corresponding to each channel. An in-phase and quadrature hybrid network receives the third signal and outputs an in-phase baseband signal and a baseband signal corresponding to each channel of the RF signal. According to the invention, a controller coupled to the dual image-reject mixer arrangement and monitors the first and second signals. The controller controls an amplitude and a phase of the image frequency signals so that the image frequency signals are collectively minimized based on the monitored first and second signals. The controller is also coupled to the feed-forward arrangement and monitors the third signal. Based on the monitored third signals, the controller controls the amplitude and the phase of the intermodulation signals so that the intermodulation signals are collectively optimally cancelled.

BRIEF DESCRIPTION OF THE DRAWING

The present invention is illustrated by way of example and not by limitation in the accompanying FIGURE that shows a schematic block diagram of a preferred embodiment of a dual image-reject mixer system for simultaneous reception and processing of multiple channels using a single receive path according to the present invention.

DETAILED DESCRIPTION

The present invention provides a low-cost, efficient technique for simultaneously receiving and processing multiple RF channels using a single receive path in which each channel has a different data rate. According to the invention, local oscillator (LO) frequencies can be flexibly and dynamically changed so that a plurality of RF channels can be optimally received and processed without the requirement for additional receive paths. Consequently, a variety of wireless services, such as satellite, terrestrial, voice, video and data services, can be advantageously implemented for users, service providers and terminal manufacturers for the wireless telecommunications infrastructure.

The present invention uses a dual image-reject mixer arrangement for enhancing desired channels, and for rejecting image frequency and intermodulation distortion signals. Conventional image-reject mixers provide an image frequency signal reduction that is on the order of 20 to 30 dB. In contrast, the present invention provides an image frequency signal reduction that is on the order of 60 to 80 dB. The present invention also provides a reduction in intermodulation distortion products that is on the order of at least 80 to 90 dB. As an additional benefit, the image frequency and intermodulation distortion signal reduction provided by the present invention results an RF receiver system having a significantly enhanced dynamic range and system sensitivity in comparison to a conventional RF receiver system.

According to the invention, a controller continuously monitors and adjusts amplitude and phase imbalances of a dual image-reject mixer arrangement, thereby minimizing the amplitude of the undesired image frequency signals. A feed-forward arrangement that is coupled to the output of the mixer arrangement further minimizes the intermodulation signals generated by the dual image-reject mixer arrangement.

The sole Figure shows a schematic block diagram of a preferred embodiment of a dual image-reject mixer system 10 for simultaneous reception and processing of multiple channels using a single receive path according to the present invention. System 10 includes a dual image-reject mixer arrangement portion 11 and a feed-forward arrangement portion 12. A multi-channel RF signal $S_{in}$ is received by an antenna 13 and bandpass filtered by a bandpass filter 14. Signal $S_{in}$ is then amplified by a low-noise amplifier (LNA) 15. The output of LNA 15 is applied to the input port of each of mixers 16a–16d, which are connected in a symmetrical configuration. Mixers 16a–16d are also matched in both amplitude and phase responses, except that mixers 16a and 16b have responses that are mirror images of each other.

Similarly, mixers 16c and 16d have responses that are mirror images of each other.

A plurality of local oscillators (LOs) 17a–17d each generate an LO drive signal that is combined by a combiner 18 to form a multi-frequency LO signal that, in turn, is applied to the LO port of each mixer 16a–16d. Preferably, each LO 17a–17d is a tunable frequency synthesizer that generates an LO signal based on a frequency reference signal 19 in response to a tuning word that is output from a tuning logic circuit 20. Tuning logic circuit 20 receives a frequency tuning word signal that is generated from a tuning control circuit (not shown). Tuning logic circuit 20 decodes the frequency tuning word signal and outputs a tuning word to the appropriate LO 17a–17d for generating a desired LO frequency signal. Preferably, each LO frequency signal of the multifrequency frequency LO signal that is applied to the LO ports of mixers 14a–14d has a magnitude of about +5 to +7 dBm.

Alternatively, the frequency synthesizers forming LOs 17a–17d can be tuned to separate and fixed frequencies when the flexibility being dynamically tuned provided by the preferred embodiment of system 10 is not required. While the preferred embodiment of the present invention is shown configured for four carrier frequencies and a corresponding number of LOs, system 10 can be configured for a different number carrier frequencies and corresponding LOs.

The output of each mixer 16a–16d includes a desired signal, an undesired image signal and an undesired intermodulation product signal. The phases of the output signals of mixers 16a–16d appearing at nodes A, B, C and D are $\phi$, ($\phi$+90°), $\phi$ and ($\phi$+90°), respectively.

The outputs of mixers 16a–16d are respectively applied to programmable variable attenuators 21a–21d. The outputs of attenuators 21a–21d are respectively applied to programmable variable phase shifters 22a–22d. Attenuators 21a–21d have identical frequency responses. Similarly, phase shifters 22a–22d have identical frequency responses. The outputs of phase shifters 22a and 22b are applied to the input ports of a quadrature hybrid coupler 23a. The outputs of phase shifters 22c and 22d are applied to the input ports of a quadrature hybrid coupler 23b. One output port of coupler 23a is terminated by impedance 24a that matches the characteristic impedance of coupler 23a and of system 10. Likewise, one output port of coupler 23b is terminated by impedance 24b that matches the characteristic impedance of coupler 23b and of system 10. Preferably, system 10 has a characteristic impedance of 50 Ohms.

The signals output from phase shifters 22a–22d undergo an additional 90° of phase shift in quadrature hybrids 23a and 23b so that the desired signals add and the undesired image frequency signals cancel. More specifically, the phase of the sum of the desired signals at node M1 is ($\phi-\theta$)+($\phi-\theta$), resulting in addition of the desired signal, while the phase of the sum of the undesired image frequency signal at node M1 is ($\theta-\phi$)−($\theta-\phi$), resulting in a cancellation of the undesired image frequency signal. Similarly, the phase of the desired signal appearing at node M2 is ($\phi-\theta$)+($\phi-\theta$) and the phase of the undesired image frequency signal is ($\theta-\phi$)+($\theta+\phi$), also resulting in a cancellation of the undesired image frequency signal.

In theory, the amplitude and phase of the respective signals appearing at nodes M1 and M2 are identical. In practice, though, component tolerances and mismatches, among other things, cause the amplitude and phase of the signals at nodes M1 and M2 to be slightly out-of-balance. To compensate for the imbalance and mismatches, the signals appearing at nodes M1 and M2 are monitored by a controller 38. Attenuators 21a–21d and phase shifters 22a–22d are adjusted accordingly by controller 38 so that the signals appearing at nodes M1 and M2 are identical within the resolution of attenuators 21a–21d and phase shifters 22a–22d.

A coupler 25a couples a portion of the signal at node M1 to controller 38. Similarly, a coupler 25b couples a portion of the signal at node M2 to controller 38. Controller 38 is preferably a microcontroller that includes RF detectors and digital-to-analog circuitry for monitoring the various RF signals coupled to controller 38.

Based on the signals coupled to controller 38 from nodes M1 and M2, attenuators 21a–21d and phase shifters 22a–22d are selectively adjusted by controller 38 so that the undesired image frequency signals associated with each LO signal that are generated by mixers 16a–16d are collectively cancelled and the desired signals are constructively combined by quadrature hybrid couplers 23a and 23b. The exact settings of attenuators 21a–21d and phase shifters 22a–22d are selected so that the rejection of the image frequencies is optimized for all image frequency signals collectively generated by mixers 16a–16d.

The signals appearing at nodes M1 and M2 are input to feed-forward arrangement portion 12. The signal appearing at node M1 passes through an amplifier 26a and is coupled out by a coupler 29a at node G. The signal passing through coupler 29a is delayed by a delay element 31, which is controlled by controller 38, before being input to a directional coupler 35.

The signal appearing at node M2 passes through an amplifier 26b. The output of amplifier 26b passes through a delay line 27 and a programmable variable attenuator 28 that are both controlled by controller 38 for effecting a partial cancellation of the desired signals at node H.

The phase of the signal coupled out by coupler 29a at node G is adjusted by a programmable phase shifter 30, which is controlled by controller 38, to be approximately 180° out-of-phase with the phase of the signal appearing at node H. The phase is adjusted at the desired signal frequency for partial cancellation of the desired signals.

A goal of the present invention is that the respective amplitudes of the desired signals in the signal path between nodes M2 and H are not equal to the corresponding amplitudes of the phase-shifted signals coupled in at node H. In such a situation, only a partial cancellation of the desired and undesired signals is achieved at node H. The resulting combined signal appearing at node H is subsequently phase shifted by phase shifter 32, which is controlled by controller 38. The output of phase shifter 32 is amplified by an amplifier 33. The phase of the signal output of amplifier 33 is adjusted by a programmable phase shifter 34, which is under the control of controller 38, so that the desired signals are constructively combined by coupler 35 at node I to form an IF signal. The resultant output power is increased by 3 dB by the constructive addition of the two desired signals being in phase and having equal amplitude at node I.

The IF signal output from coupler 35 passes through a bandpass filter 36 for further reducing out-of-band signals. Subsequently, a portion of the IF signal is coupled to controller 38 by a coupler 37. Based on the portion of the IF signal coupled to controller 38 by coupler 37, controller 38 controls the respective levels and phases of the desired and undesired signals for optimum cancellation of the undesired intermodulation frequency signals. By using the approach of the present invention, an image frequency signal rejection of 60 to 80 dB can be achieved in comparison to the image frequency signal rejection of 20 to 30 dB that can be achieved by a conventional image rejection mixer depending on the frequency. Further, the present invention achieves an overall intermodulation distortion signal reduction that is on the order of 80 to 90 dB.

The IF signal output from coupler 37 is input to an in-phase and quadrature (I/Q) hybrid network 39 for further demodulation to baseband frequencies. An LO signal output from LO 40 is applied to hybrid network 39 for generating in-phase and quadrature signal components for each baseband signal of the IF signal. Baseband filters 41a–41d are coupled to the in-phase output port of hybrid network 39 for further rejecting out-of-band spurious signals. Similarly, baseband filters 42a–42d are coupled to the quadrature output of hybrid circuit 39. The output of baseband filters 41a–41d and 42a–42d are input to a baseband processor (not shown) for processing in a well-known manner.

Additional cost reduction is achieved when the present invention is fabricated using Microwave Monolithic Integrated Circuit (MMIC) technology for producing a module for integration into a receiver front-end for single or multiple channel reception, such as a single or a multiple channel TDMA/CDMA receiver.

While the present invention has been described in connection with the illustrated embodiments, it will be appreciated and understood that modifications may be made without departing from the true spirit and scope of the invention.

What is claimed is:

1. An RF receiver, comprising:
   a dual image-reject mixer arrangement receiving an RF signal having multi-channels and including a local oscillator for each channel, each local oscillator signal having a frequency component corresponding to each channel of the RF signal, the dual image-reject mixer arrangement providing responses which mirror each other in generating first and second signals corresponding to each channel of the RF signal, the first and second signal corresponding to each channel being substantially equal, and the first and second signals corresponding to each channel including a desired signal, an undesired image frequency signal and an intermodulation signal; attenuation and phase shifting apparatus for canceling the undesired image frequency signal; and
   a feed-forward arrangement including phase shifters and receiving the first and second signals corresponding to each channel and outputting a third signal, the third signal being formed by constructively combining the desired signals corresponding to each channel and substantially canceling the intermodulation signals corresponding to each channel.

2. The RF receiver according to claim 1, further comprising a controller coupled to the feed-forward arrangement, the controller monitoring the third signal and controlling an amplitude and a phase of the intermodulation signals so that the intermodulation signals are collectively optimally cancelled based on the monitored third signal.

3. The RF receiver according to claim 1, further comprising a controller coupled to the dual image-reject mixer arrangement, the controller monitoring the first and second signals and controlling an amplitude and a phase of the image frequency signals so that the image frequency signals are collectively minimized based on the monitored first and second signals.

4. The RF receiver according to claim 3, where the controller is further coupled to the feed-forward arrangement, the controller monitoring the third signal and controlling the amplitude and the phase of the intermodulation signals so that the intermodulation signals are collectively optimally cancelled based on the monitored third signal.

5. The RF receiver according to claim 1, further comprising an in-phase and quadrature hybrid network receiving the third signal and outputting an in-phase baseband signal and a quadrature baseband signal corresponding to each channel of the RF signal.

6. A method for minimizing image frequency and intermodulation distortion signal components generated by an RF receiver, the method comprising the steps of:
   receiving a RF signal having multi channels;
   generating in a dual—image reject mixer responses which mirror each other in generating first and second signals corresponding to each channel of the RF signal, the first and second signal corresponding to each channel being substantially equal, and the first and second signals corresponding to each channel each including a desired signal, an undesired image frequency signal and an intermodulation signal;
   canceling the undesired image frequency signal using an attenuation and phase shifting apparatus; and
   combining the first and second signals corresponding to each channel so that the desired signals corresponding to each channel are constructively combined and the intermodulation signals are substantially cancelled.

7. The method according to claim 6, further comprising the steps of
   monitoring the third signal; and
   controlling an amplitude and a phase of the intermodulation signals so that the intermodulation signals are collectively optimally cancelled based on the monitored third signal.

8. The method according to claim 6, further comprising the steps of
   monitoring the first and second signals; and
   controlling an amplitude and a phase of the image frequency signals so that the image frequency signals are collectively minimized based on the monitored first and second signals.

9. The method according to claim 8, further comprising the steps of:
   monitoring the third signal; and
   controlling the amplitude and the phase of the intermodulation signals so that the intermodulation signals are collectively optimally cancelled based on the monitored third signal.

10. The method according to claim 6, further comprising the steps of:
    quadrature demodulating the third signal; and
    outputting an in-phase baseband signal and a quadrature baseband signal corresponding to each channel of the RF signal.

11. A receiver for simultaneously processing an RF signal having multiple channels, and rejecting multiple image frequencies in the channels, comprising:
    a dual image-reject mixer arrangement receiving the RF signal having multi-channels and including a local oscillator in each channel, each local oscillator signal having a frequency component corresponding to each channel of the RF signal, the dual image-reject mixer arrangement generating first and second signals corresponding to each channel of the RF signal, the first and second signal corresponding to each channel being substantially equal, and including a desired signal, an image frequency signal and an intermodulation signal;

a feed-forward arrangement receiving the first and second signals corresponding to each channel and outputting a third signal, the third signal being formed by constructively combining the desired signals corresponding to each channel and substantially canceling the intermodulation signals corresponding to each channel; and an in-phase and quadrature hybrid network receiving the third signal and outputting an in-phase baseband signal and a quadrature baseband signal corresponding to each channel of the RF signal.

* * * * *